United States Patent
Krug et al.

(10) Patent No.: US 12,483,238 B2
(45) Date of Patent: Nov. 25, 2025

(54) DRIVER CIRCUIT WITH A MULTI-FUNCTION PIN USED FOR IN-LINE CHARACTERIZATION OF A POWER SWITCH

(71) Applicant: Infineon Technologies AG, Neubiberg (DE)

(72) Inventors: Michael Krug, Munich (DE); Marcus Nuebling, Olching-Esting (DE)

(73) Assignee: Infineon Technologies AG, Neubiberg (DE)

( * ) Notice: Subject to any disclaimer, the term of this patent is extended or adjusted under 35 U.S.C. 154(b) by 27 days.

(21) Appl. No.: 18/510,426

(22) Filed: Nov. 15, 2023

(65) Prior Publication Data

US 2025/0158611 A1    May 15, 2025

(51) Int. Cl.
*H03K 17/687* (2006.01)

(52) U.S. Cl.
CPC ................................... *H03K 17/687* (2013.01)

(58) Field of Classification Search
CPC .................................................. H03K 17/687
See application file for complete search history.

(56) References Cited

U.S. PATENT DOCUMENTS

| | | | |
|---|---|---|---|
| 2018/0102773 A1* | 4/2018 | Li | H03K 17/18 |
| 2019/0131964 A1* | 5/2019 | Bryant | H03K 17/74 |
| 2020/0076425 A1* | 3/2020 | Garg | H03K 17/6871 |
| 2022/0182004 A1* | 6/2022 | Heckroth | H02P 27/085 |

FOREIGN PATENT DOCUMENTS

| | | |
|---|---|---|
| EP | 2445110 A1 | 4/2012 |
| EP | 4070456 A1 | 10/2022 |
| EP | 2546985 A2 | 1/2023 |
| JP | 2009225506 A | 10/2009 |
| WO | 2021110661 A1 | 6/2021 |

OTHER PUBLICATIONS

Rosahl et al., "On-Chip and Inline Characterization of SiC-MOSFET physical Parameters for Optimized Gate Drive Control", Applied Power Electronics Conference, Mar. 19, 2023, 18 pp.

* cited by examiner

*Primary Examiner* — Sibin Chen
(74) *Attorney, Agent, or Firm* — Shumaker & Sieffert, P.A.

(57) ABSTRACT

This disclosure is directed to a driver circuit configured to control a power switch. The driver circuit may comprise an output pin, wherein the driver circuit is configured to deliver drive signals from the output pin to the power switch to control turn ON of the power switch; a multi-function pin; and a state machine configured to define operation of the driver circuit using the multi-function pin, wherein the state machine is configured to select among a soft turn OFF mode, a clamping mode, and an in-line characterization mode.

17 Claims, 8 Drawing Sheets

DRIVER CIRCUIT WITH A MULTI-FUNCTION PIN USED FOR IN-LINE CHARACTERIZATION OF A POWER SWITCH

TECHNICAL FIELD

This disclosure relates to driver circuits for controlling power switches, and more specifically, techniques and driver circuits for measuring characteristics of a power switch.

BACKGROUND

Power switches are used in a wide variety of applications in order to control power being delivered to a load. As examples, a power switch may comprise a Field Effect Transistor (FET), a bipolar junction transistor (BJT), a gallium nitride (GaN) switch, or a silicon carbide (SiC) switch, or possibly a silicon-controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials. Examples of BJTs may include, but are not limited to, PNP, NPN, heterojunction, or any other type of BJT, or any combination of the same.

Power switches are typically controlled by a driver circuit via a modulation control signal, such as pulse width modulation (PWM), pulse frequency modulation (PFM), pulse duration modulation, pulse density modulation, or another type of modulation control signal. Modulation control signals can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or current fed to a load can be controlled by turning the switch on and off at a fast rate. The longer the switch is on compared to the off periods, the higher the total power supplied to the load. In many applications, two different power switches are configured in a high-side and low-side configuration, and the on/off switching of the two power switches is synchronized in order to deliver the desired power to a switch node positioned between the high-side and low-side switch.

SUMMARY

In general, this disclosure describes circuits and techniques that facilitate in-line characterization of a power switch. In-line characterization refers to characterization that occurs during the operation of the power switch in the field, i.e., after the power switch is arranged within a vehicle or within another device or system. According to this disclosure, a driver circuit includes a multi-functional pin, which may be used both for in-line characterization measurements on the power switch and for other power switch control functions, such as soft turn off or clamping. A current source used for soft-turn off on the multi-functional pin, for example, can be reused to facilitate the in-line characterization measurements. Moreover, the in-line characterization measurements may be performed during a turn OFF of the power switch, which can provide differences and advantages over other techniques.

In some examples, this disclosure describes a driver circuit configured to control a power switch. The driver circuit may comprise an output pin, wherein the driver circuit is configured to deliver drive signals from the output pin to the power switch to control turn ON of the power switch; a multi-function pin; and a state machine configured to define operation of the driver circuit using the multi-function pin, wherein the state machine is configured to select among a soft turn OFF mode, a clamping mode, and an in-line characterization mode.

In some examples, this disclosure describes a method of operating a driver circuit for controlling a power switch, the method comprising: delivering drive signals from an output pin to the power switch to control turn ON of the power switch; and controlling a multi-function pin via a state machine, wherein the state machine is configured to select among a soft turn OFF mode for the power switch, a clamping mode for the power switch, and an in-line characterization mode for the power switch.

In some examples, this this disclosure describes a system comprising: a power switch; a driver circuit configured to control the power switch based on drive signal; and a processor configured to deliver control signals to the driver circuit, wherein the control signals define the drive signals. The driver circuit comprises: an output pin, wherein the driver circuit is configured to deliver the drive signals from the output pin to the power switch to control turn ON of the power switch; a multi-function pin; and a state machine configured to define operation of the driver circuit using the multi-function pin, wherein the state machine is configured to select among a soft turn OFF mode, a clamping mode, and an in-line characterization mode.

Details of these and other examples are set forth in the accompanying drawings and the description below. Other features, objects, and advantages will be apparent from the description and drawings, and from the claims.

DETAILED DESCRIPTION

This disclosure describes circuits and techniques that are applied by a driver circuit in controlling and characterizing a power switch. In particular, this disclosure describes circuits and techniques that facilitate in-line characterization of a power switch, which refers to characterization that occurs during the operation of the power switch in the field, i.e., after the power switch is arranged within a vehicle or within another device or system.

According to this disclosure, a driver circuit includes a multi-functional pin. The driver circuit may also include a state machine to control the operational state of the multi-functional pin. The multi-functional pin can be used for control functions, such as soft turn off functions or clamping functions. In addition, the multi-functional pin can also be used to perform in-line characterization measurements on the power switch. A current source associated with the multi-functional pin may be configured to deliver different levels of current to the multi-functional pin for the different functions. Therefore, the same current source used for soft turn-off or clamping functions can be leveraged and used for in-line characterization measurements without the need for an additional current source. Moreover, the in-line characterization measurements may be performed during a turn OFF of the power switch, which can provide differences and advantages over other techniques.

Figure 1:
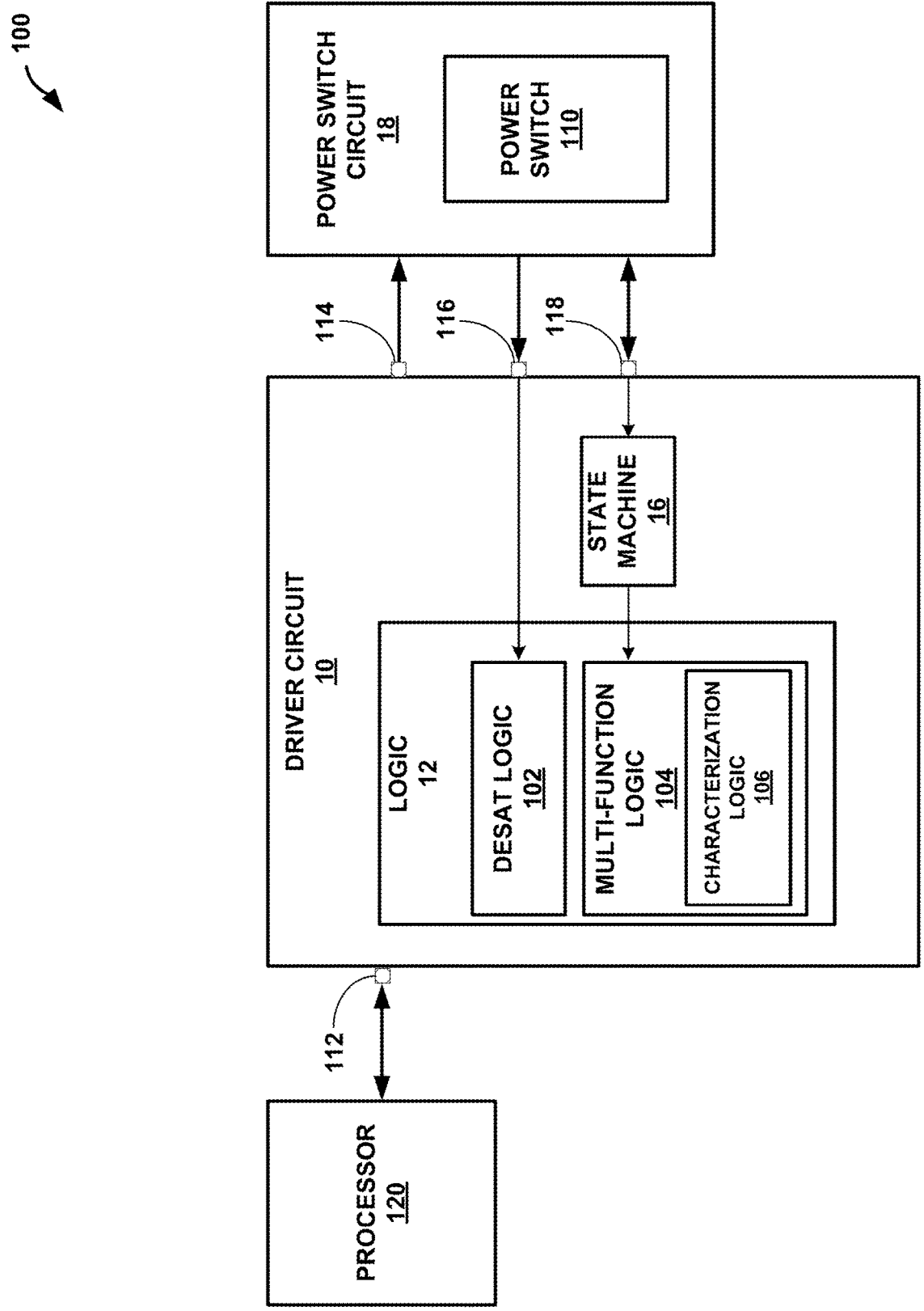
FIG. 1 is a block diagram of an example system that includes a power switch circuit, a driver circuit, and a controller.

FIG. 1 is a block diagram of an example system 100 that includes a power switch circuit 18, a driver circuit 10, and a controller processor 120. Processor 120 may comprise a microprocessor or other type of controller circuit configured to control driver circuit 10. In particular, processor 120 sends command signals to driver circuit 10 via input pin 112. Based on these command signals, driver circuit 10 sends ON/OFF signals (e.g., gate control signals) to power switch circuit 110 to turn the power switch ON or OFF.

Driver circuit 10 may control power switch 110 via modulation signals on output pin 114, which may control the ON/OFF switching of power switch 110 within power switch circuit 18. In particular, driver circuit 10 is configured to deliver drive signals (e.g., modulation signals) from output pin 114 to power switch 110 to control turn ON (and turn OFF) of power switch 110. The modulation signals, for example, may comprise pulse width modulation (PWM) signals, pulse frequency modulation (PFM) signals, pulse duration modulation signals, pulse density modulation signal, or another type of modulation control signal use to control a power transistor. In normal operation, the signals from driver circuit 10 over output pin 114 can be applied to the gate (or other control terminal) of power switch 110 so as to control on/off switching of power switch 110, and thereby control the average amount of power delivered through the power switch to a load (not shown in FIG. 1). In the most general sense, driver circuit 10 may comprise any type of driver for any type of power switch, e.g., a high-side switch driver, a low-side switch driver, or any driver used in any circuit arrangement that controls ON/OFF switching of one or more power switches.

Power switch 110 may comprise a transistor. For example, power switch 110 may comprise an insulated gate bipolar transistor (IGBT), or a field effect transistor (FET), such as a metal oxide field effect transistor (MOSFET) or a gallium nitride FET. MOSFETs may be formed in silicon, in which case the MOSFET may be called a silicon MOSFET. Alternatively, the FET may be formed in another semiconductor material, such as silicon carbide (SiC) or gallium nitride (GaN), in which case the FET may be called a SiC MOSFET or a GaN FET.

Driver circuit 10 may include logic 12 connected to power switch circuit 18 for performing detection, control, and/or monitoring functions. Logic 12 may be implemented in circuitry. Logic 12 may include so-called desaturation (DESAT) logic 102 connected to a DESAT detection pin 116. DESAT logic 102 refers to logic that is configured to determine whether power switch 110 within power switch circuit 18 is operating in a desaturation mode or an overcurrent state. DESAT detection pin 116 may be configured to receive a signal associated with power switch 110 (and associated with other circuit elements within power switch circuit), and DESAT logic 102 may be configured to detect whether power switch 110 is in a desaturation mode. A desaturation mode, as defined herein, may generally refer to desaturation state of an IBGT or to an overcurrent state of a MOSFET. DESAT logic 102, for example, may be configured to disable power switch 110 in response to detecting that power switch 110 is operating in the desaturation mode. In the example of desaturation, in order to detect whether the power switch is in the desaturation mode, DESAT logic 102 may be configured to compare a signal magnitude of the signal on DESAT detection pin 116 to a desaturation threshold. The signal detected on DESAT detection pin 116, for example, may comprise a measure of the voltage drop across power switch 110 within power switch circuit 18. In some cases, this voltage drop across power switch 110 may be referred to as a "Vce" voltage, which typically indicates a voltage between a collector and an emitter of an IGBT. In the case of a MOSFET, the voltage drop over power switch 110 detected on DESAT detection pin 116 refers to the drain-to-source voltage.

According to this disclosure, driver circuit 10 includes a multi-function pin 118, and a state machine 16 configured to define operation of driver circuit 10 using the multi-function pin 118. State machine 16 may be implemented by dedicated hardware, or processing circuitry. In other words, state machine 16 may be implemented in circuitry as part of driver circuit 10. State machine 16, for example, may configure driver circuit 10 to operate in functional mode to functionally control power switch 110, or an in-line characterization mode to perform characterization measurements on power switch 110. In some examples, the functional modes may comprise a soft turn OFF mode to turn off power switch 110, and a clamping mode to clamp power switch 110. Thus, state machine 16 may be configured to configure driver operation of multi-functional pin 118 among a soft turn OFF mode, a clamping mode, and an in-line characterization mode.

Multi-functional logic 104 includes characterization logic 106 that is configured to perform an in-line characterization process to measure one or more circuit parameters of the power switch in response to state machine 16 defining operation of multi-functional pin 118 for the in-line characterization mode. For example, the in-line characterization process performed by characterization logic 106 may include a measurement of a voltage threshold associated with the power switch during a turn OFF phase, wherein a turn ON delay is determined based on the voltage threshold associated with the power switch during a turn OFF phase. The turn ON behavior of power switch 110 may generally mirror the turn OFF behavior of power switch 110, and therefore, turn ON delay can be determined based on the voltage threshold associated with the power switch during a turn OFF phase. Moreover, in some examples, measurements performed during the turn OFF phase can provide advantages relative to measurements otherwise performed during a turn ON phase. For example, a current source used for soft turn off and clamping functionality can be reused by characterization logic 106 for the in-line characterization process, thereby avoiding the need for an additional current source for the in-line characterization process.

In some examples, for yet additional accuracy in the characterization process, the in-line characterization process performed by characterization logic 106 may include a first measurement of voltage threshold associated with the power switch during a turn ON phase and a second measurement of the voltage threshold associated with the power switch during a turn OFF phase, wherein the voltage threshold associated with the power switch is defined based on a combination of the first measurement and the second measurement. In this case, two current sources may be needed, one for performing characterization measurements during turn ON and one for performing characterization measurements during turn OFF. Moreover, in some examples, the voltage threshold associated with power switch 110 may be defined as a function of temperature, based on the combination of the first measurement and the second measurement, and based on one or more temperature measurements associated with power switch 110. If both turn ON and turn OFF measurements are used, the voltage threshold associated with power switch 110 may be defined based on a mean value (or another combined metric) of the first measurement and the second measurement.

In general, wherein the in-line characterization process may include one or more measurements of gate voltage associated with power switch 110. In addition, the in-line characterization process performed by characterization logic 106 may include one or more measurements of delay associated with the power switch turning ON or OFF. In some examples, the in-line characterization process performed by characterization logic 106 includes one or more measurements of gate voltage associated with power switch 110 during a turn OFF phase of the power switch, and driver circuit 10 (e.g., characterization logic 106) may be configured to determine one parameters of delay associated with power switch during 110 the turn OFF phase of the power switch based on the one or more measurements of gate voltage.

Also, in some examples, DESAT detection pin 114 can be leveraged in the in-line characterization process. For example, driver circuit 10 may include DESAT detection pin 116 and a comparator (not shown in FIG. 1). In this case, the comparator may be configured to perform the one or more measurements of gate voltage associated with power switch 110, wherein driver circuit 10 further includes a timer (not shown in FIG. 1) comprising a clock and a counter configured track a delay parameter associated with the power switch, wherein the timer is triggered based on an event detected by DESAT detection pin 116 of the driver circuit 10.

In some examples, rather than using a comparator, driver circuit 10 may include an analog-to-digital converter (not shown in FIG. 1), which may be configured to perform the one or more measurements of gate voltage associated with the power switch. In this example, driver circuit 10 may include a timer comprising a clock for identifying equidistant points in time for the ADC to perform the one or more measurements of gate voltage.

In some examples, the in-line characterization process performed by characterization logic 106 may include: one or more measurements of gate voltage associated with the power switch during a turn OFF phase of the power switch, and one or more measurements of gate voltage associated with the power switch during a turn ON phase of the power switch. In this case, driver circuit 10 (e.g., characterization logic 106) may determine one or more measurements of turn-OFF delay associated with the power switch based on both the one or more measurements of gate voltage during the turn OFF phase and the one or more measurements of gate voltage during the turn ON phase; and determine one or more measurements of turn-ON delay associated with the power switch based on both the one or more measurements of gate voltage during the turn OFF phase and the one or more measurements of gate voltage during the turn ON phase. An analog-to-digital converter (not shown in FIG. 1) may be configured to perform the one or more measurements of gate voltage associated with the power switch during the turn-ON phase and during the turn-OFF phase; and a timer comprising a clock for identifying equidistant points in time for the ADC to perform the one or more measurements of gate voltage during the turn OFF phase and during the turn ON phase. The circuit parameters may include a delay parameter, and driver circuit 10 may be is further configured to determine a gate charge parameter based on delay parameter and a level of current used on the multi-function pin 118. The driver circuit 10 can also be configured to determine a capacitance associated with the power switch based on gate charge and gate voltage. Alternatively, gate charge and/or capacitance can be determined by processor 120, and driver circuit may use a digital interface e.g., over input pin 112) to communicate measured parameters back to processor 120, whereby driver circuit 10 is configured to output one or more in-line characterization parameters to processor 120 in response to operating in the in-line characterization mode.

Driver circuit 10 may include one or more current sources connected to multi-function pin 118. In some examples, the one or more current sources may be configured to define three different levels of current on multi-function pin 118, wherein a first level of current is defined for the soft turn OFF mode, a second level of current is defined for the clamping mode, and a third level of current is defined for the in-line characterization mode. State machine 16 may select the correct current level for multi-functional pin 118 for each mode. As examples, the first level of current may be on the order of 1 amp, the second level of current may be on the order of 10 amps, and the third level of current (i.e., that used for in-line characterization) may be in a range of 100 microamps to 1 milliamp. In the soft turn off mode, driver circuit 10 may be configured to use multi-functional pin 118 to turn OFF power switch 110 when power switch is ON. In the clamping mode, driver circuit 10 may be configured to use multi-functional pin 118 to ensure that power switch 110 remains OFF when power switch 110 is OFF. In the in-line characterization mode, driver circuit 10 may be configured to use multi-functional pin 118 to perform one or more measurements of one or more operational characteristics of power switch 110.

Figure 2:
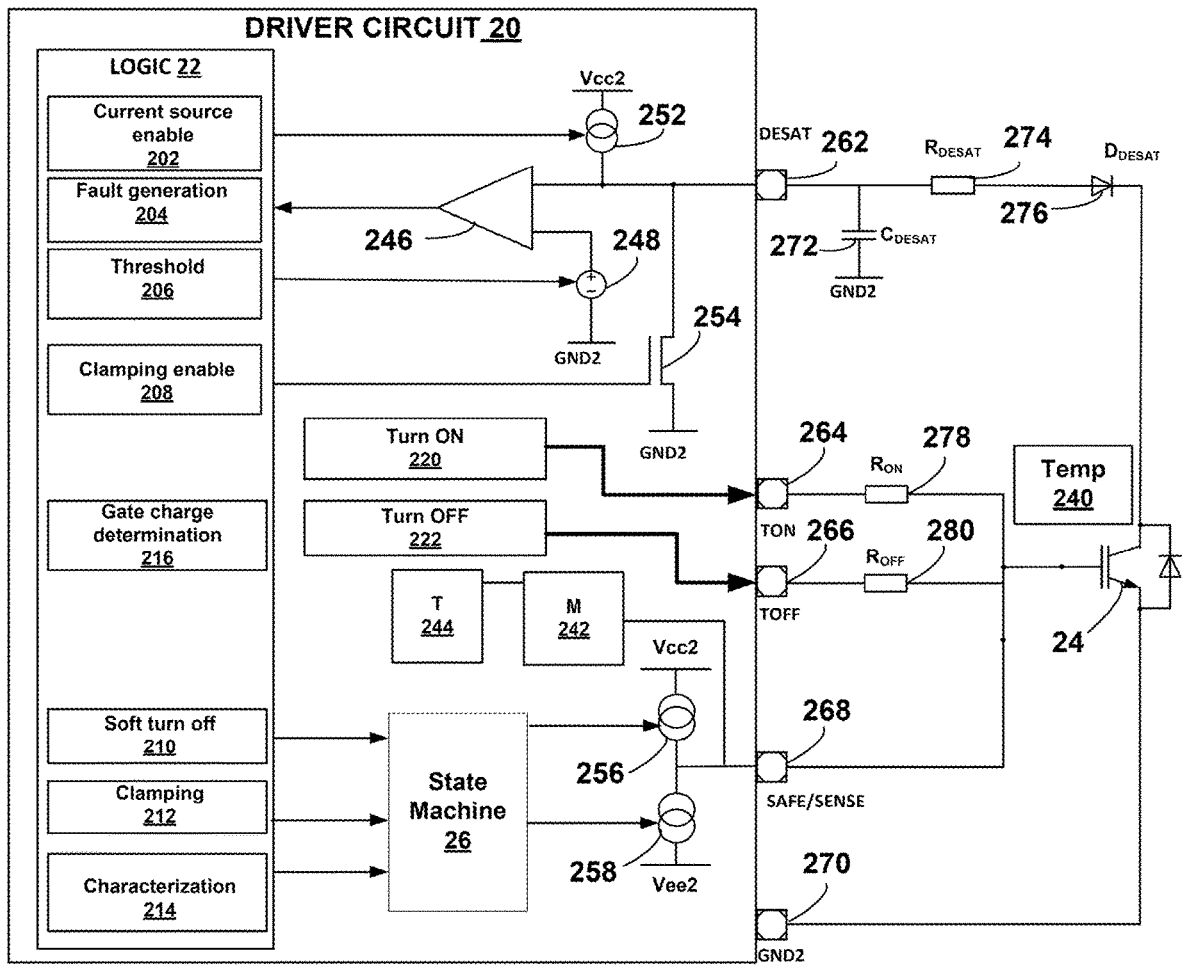
FIG. 2 is a block diagram of an example gate driver circuit consistent with one or more examples of this disclosure.

FIG. 2 is a block diagram of an example gate driver circuit 20 consistent with one or more examples of this disclosure. In some examples, gate driver circuit 20 of FIG. 2 may correspond to gate driver circuit 10 of FIG. 1. Gate driver circuit 20 is configured to control a power switch circuit 24. A processor (not shown in FIG. 2 but shown as processor 120 in FIG. 1) may send commands and receive signals (e.g., measurements or fault signals) from gate driver circuit 20, 10.

Power switch 24 may comprise a transistor. For example, power switch 24 may comprise an IGBT, or FET, such as a MOSFET or a gallium nitride FET. MOSFETs may be formed in silicon, in which case the MOSFET may be called a silicon MOSFET. Alternatively, the FET may be formed in another semiconductor material, such as SiC or GaN, in which case the FET may be called a SiC MOSFET or a GaN FET.

Driver circuit 20 may control power switch 24 via modulation signals on output pins ($T_{ON}$ pin 264, and $T_{OFF}$ pin 266), which may control the ON/OFF switching of power switch 24. In particular, turn ON circuit 220 may deliver turn ON signals on $T_{ON}$ pin 264 which pass through $R_{ON}$ resistor 278 to deliver the proper turn ON voltage to the gate of power switch 24. Similarly, turn OFF circuit 222 may deliver turn OFF signals on $T_{OFF}$ pin 266 which pass through $R_{OFF}$ resistor 280 to deliver the proper turn OFF voltage to the gate of power switch 24. Ground pin 270 is connected to a reference voltage and to the source/emitter of power switch 24.

Driver circuit 20 may include logic 22 configured to cause driver circuit 20 to perform detection, control, and/or monitoring functions with regard to power switch 24. Logic 22 may include so-called desaturation DESAT logic connected to a DESAT detection pin 262. DESAT logic refers to logic that is configured to determine whether power switch is operating in a desaturation mode or an overcurrent state. DESAT detection pin 262 may be configured to receive a signal associated with power switch 24 and associated with other external DESAT circuit elements of the power switch circuit (i.e., DESAT capacitor 272, DESAT resistor 274 and DESAT diode 276). In particular DESAT diode 276 is arranged as a reverse biased diode relative to power switch 24, and DESAT diode 276 is arranged in series with DESAT resistor 274. DESAT capacitor 272 is connected to ground and arranged in parallel with DESAT resistor 274 and DESAT diode 276.

In this example, DESAT logic may include current source enable logic 202 that is configured to enable current source 252 for DESAT functions. Fault generation logic 204 is configured to communicate any DESAT fault signals to an external processor. Threshold generator 206 is configured to define the DESAT threshold voltage stored in charge unit 248 and applied in the DESAT detection process. A clamping enable logic 208 is configured to control clamping transistor 254 to clamp the voltage on DESAT pin 262 during the DESAT detection process. A DESAT comparator 246 compare the threshold defined in threshold generator 206 to the voltage detected on DESAT pin 262 to determine if power switch 24 is operating in a desaturation mode (i.e., desaturation for an IGBT or overcurrent for a MOSFET).

According to this disclosure, driver circuit 20 includes a multi-function pin 268 (labeled as "safe/sense pin"), and a state machine 26 configured to define operation of driver circuit 20 using the multi-function pin 268. State machine 26, for example, may configure driver circuit 20 to operate in functional mode so as to functionally control power switch 24 via multi-function pin 268, or alternatively, state machine 26 may configure driver circuit to operate an in-line characterization mode to perform characterization measurements on power switch 24 via multi-function pin 268. In some examples, the functional modes may comprise a soft turn OFF mode controlled by soft turn off logic 210 to turn off power switch 24. The functional modes may also comprise a clamping mode controlled by clamping logic 212 to clamp power switch 24. Characterization logic 214 is configured to enable the characterization mode using multi-functional pin 268. Thus, state machine 26 may be configured to select among a soft turn OFF mode, a clamping mode, and an in-line characterization mode over multi-functional pin 268 based on enable signals from logic elements 210, 212, or 214 (collectively referred to as multi-functional logic 210, 212, 214). State machine 26, for example, may select the correct current level for multi-functional pin 268 for each mode.

Multi-functional logic 210, 212, 214 includes characterization logic 214 that is configured to perform an in-line characterization process to measure one or more circuit parameters of the power switch in response to state machine 26 defining operation of multi-functional pin 268 for the in-line characterization mode. For example, the in-line characterization process performed by characterization logic 214 may include a measurement of a voltage threshold associated with the power switch during a turn OFF phase, wherein a turn ON delay is determined based on the voltage threshold associated with the power switch during a turn OFF phase. The turn ON behavior of power switch 24 may generally mirror the turn OFF behavior of power switch 24, and therefore, turn ON delay can be determined based on the voltage threshold associated with the power switch during a turn OFF phase. Moreover, in some examples, measurements performed during the turn OFF phase can provide advantages relative to measurements otherwise performed during a turn ON phase. For example, a current source 258 (e.g., at a turn off voltage Vee2), which can be used for soft turn off and clamping functionality, can be reused by characterization logic 214 for the in-line characterization process, thereby avoiding the need for an additional current source for the in-line characterization process. Additional current source 256 is optional and avoiding the need for additional current source 256 is desirable for some situations.

The example of FIG. 2 shows an additional current source 256 (again, which is optional). In some examples, for a higher level of accuracy in the characterization process, the in-line characterization process performed by characterization logic 214 may include a first measurement of voltage threshold associated with the power switch during a turn ON phase (using additional current source 256 operating at a turn ON voltage Vcc2) and a second measurement of the voltage threshold associated with the power switch during a turn OFF phase (using the pre-existing current source 258 operating at a turn OFF voltage Vee2). In this case, the voltage threshold associated with power switch 24 is defined based on a combination of the first measurement and the second measurement. In this case, two current sources 256, 258 are needed, one for performing characterization measurements during turn ON and one for performing characterization measurements during turn OFF. Moreover, in some examples, the voltage threshold associated with power switch 24 may be defined as a function of temperature (e.g., determined by a temperature sensor 240 associated with power switch 24), based on the combination of the first measurement and the second measurement, and based on one or more temperature measurements by temperature sensor 240 associated with power switch 24. If both turn ON and turn OFF measurements are used, the voltage threshold associated with power switch 24 may be defined based on a mean value (or another combined metric) of the first measurement and the second measurement.

In general, wherein the in-line characterization process may include one or more measurements of gate voltage associated with power switch 24. In addition, the in-line characterization process performed by characterization logic 214 may include one or more measurements of delay associated with the power switch turning ON or OFF. In some examples, the in-line characterization process performed by characterization logic 214 includes one or more measurements of gate voltage associated with power switch 24 during a turn OFF phase of the power switch. Driver circuit 20 (e.g., characterization logic 214) may be configured to determine one parameters of delay associated with power switch during 24 the turn OFF phase of the power switch based on the one or more measurements of gate voltage.

Also, in some examples, DESAT detection pin 262 can be leveraged in the in-line characterization process. For example, driver circuit 20 may include a measurement unit 242 in the form of a comparator and a timing unit 244 in the form of a clock and a counter. In this case, measurement unit 242 in the form of a comparator may be configured to perform the one or more measurements of gate voltage associated with power switch 24 and timing unit 244 comprising a clock and a counter may be configured track a delay parameter associated with power switch 24, wherein timing unit 244 is triggered based on an event detected by DESAT detection pin 262 of the driver circuit 20.

In some examples, rather than using a comparator, driver circuit 20 may include an analog-to-digital converter (ADC). In this case, measurement unit 242 comprises the ADC, and timing unit 244 comprises a clock for identifying equidistant points in time for the ADC to perform the one or more measurements of gate voltage of power switch 24. Additional details of the example using the comparator and example using the ADC are provided below in discussing the various graphs in the Figures.

In some examples, in-line characterization process performed by characterization logic 214 may include: one or more measurements of gate voltage associated with the power switch during a turn OFF phase of the power switch, and one or more measurements of gate voltage associated with the power switch during a turn ON phase of the power switch. In this case, driver circuit 20 (e.g., characterization logic 214) may determine one or more measurements of turn OFF delay associated with the power switch based on both the one or more measurements of gate voltage during the turn OFF phase and the one or more measurements of gate voltage during the turn ON phase; and determine one or more measurements of turn ON delay associated with the power switch based on both the one or more measurements of gate voltage during the turn OFF phase and the one or more measurements of gate voltage during the turn ON phase. Measurement unit 242 in the form of an ADC may be configured to perform the one or more measurements of gate voltage associated with the power switch during the turn ON phase and during the turn OFF phase, and timing unit 244 comprising a clock may be configured to identify equidistant points in time for the ADC of measurement unit 242 to perform the one or more measurements of gate voltage during the turn OFF phase and during the turn ON phase. The circuit parameters may include a delay parameter, and in some examples, driver circuit 20 may include a gate charge determination logic 216 configured to determine a gate charge parameter based on delay parameter and a level of current used on the multi-function pin 268. The driver circuit 20 can also be configured to determine a capacitance associated with the power switch based on gate charge and gate voltage. Alternatively, gate charge and/or capacitance can be determined by an external processor, in which case, driver circuit 20 may use a digital interface to communicate measured parameters back to the processor. In this case, driver circuit 20 may be configured to output one or more in-line characterization parameters to the processor in response to operating in the in-line characterization mode.

In some examples, current source 258 may be configured to define three different levels of current on multi-function pin 268, wherein a first level of current is defined for the soft turn OFF mode, a second level of current is defined for the clamping mode, and a third level of current is defined for the in-line characterization mode. As examples, the first level of current may be on the order of 1 amp, the second level of current may be on the order of 10 amps, and the third level of current (i.e., that used for in-line characterization) may be in a range of 100 microamps to 1 milliamp. State machine 26 may define the correct current level of current source 258 for operation of multi-functional pin 268 in the different modes. Additional current source 256 (if used) may also define the third level of current (i.e., that used for in-line characterization), which may be in a range of 100 microamps to 1 milliamp.

In the soft turn off mode, soft turn off logic 210 may be configured to use multi-functional pin 268 to turn OFF power switch 24 when power switch is ON. In the clamping mode, clamping logic 212 may be configured to use multi-functional pin 268 to ensure that power switch 24 remains OFF when power switch 24 is OFF. In the in-line characterization mode, characterization logic 214 may be configured to use multi-functional pin 268 to perform one or more measurements of one or more operational characteristics of power switch 24.

Inline characterization of the power switches is desirable to help identify and predict problems before they occur. Thus, with inline characterization, predictive maintenance on power switch 24 can be improved, e.g., alerting to possible power switch problems or trends before power switch failure occurs and allowing a replacement power switch to be installed before problems occur.

It is desirable to implement multiple different independent functions (characterization mode for external switch, soft shut down, active miller clamping) with a shared pin and a programmable current source together with a dedicated state machine for generating the needed current values in the current source and the related evaluations circuits.

The safe turn off functionality is a desirable function in response to a severe failure where power switch 24 must be turned off in a safe manner. With other techniques, safe turn off may be performed via an additional internal clamping stage to the negative voltage rail with an independent external resistor. The clamping feature clamps the gate in a low impedance path to prevent the parasitic turn on generated by the miller current inside a half-bridge topology in case the power switch 24 is turned off. With other techniques, clamping is typically done by an additional independent clamping stage to Vee2. A configurable current source, according to this disclosure, may be used to measure the characteristics of the power semiconductor by configuring a small current, combined with the information of the gate timing and the DESAT voltage detector. The techniques of this disclosure may combine three features, only needing a single current source 258, and a dedicated state machine (i.e., state machine 26) to change the value of the currents of current source 258 in relation to the three different functions. As these three functions will never be used at the same time by driver circuit 20, this very compact multi-functional implementation is possible. The measured characteristics of the power switch 24 can either be saved or used in driver circuit 20, which can send an alert to the processor in case of problems being identified, or the measured information can be sent by driver circuit 20 back to the external processor to compare the results of the actual measurements with previous measurements or expectations to determine if problems may exist. In the case where a driver circuit cannot detect the change of the voltage on DESAT pin, an internal ADC can be used to measure the gate shape of the turn off sequence during the characterization phase.

The techniques of this disclosure may enable power switch to be characterized during use within a system. With characterization information, power switch customers can react on aging processes and increase the detectability for predictive maintenance of power switches within customer systems. The techniques of this disclosure provide opportunities to measure characteristic data of the power switches over their lifetime. With this, a reliability model can be updated based on the measured characteristics and predictive maintenance can be performed before power switch failure occurs.

Inline characterization refers to characterization when the power switch is in use. The inline characterization may measure or calculate key technology parameters (e.g., Vgs threshold, Crss, Turn ON Delay, Turn OFF delay, charge, or other parameters) during lifetime of the power switch. Again, in-line characterization can help improve predictive maintenance of power switches within vehicles or other systems, and may provide system level information as more and more vehicles are directly connected to a cloud (i.e., a computer network). Predictive maintenance requirements, for example, are sometimes desirable for safety of the main inverter of a vehicle. Dynamic lifetime control is not possible without updated characterization of aging of the power semiconductors. In some examples, in-line characterization of power switch parameters enables a more efficient parallelizing and driving with e.g., a configurable current source.

The techniques of this disclosure use a combination of three independent functionalities:
SOFT OFF
GATE/CLAMP
In-line characterization All three of these features are independent and never used at the same time, and therefore everything can be combined into a single pin of the driver circuit. The pin can be controlled by an internal state machine dependent of the operation mode of the driver circuit. The state machine may define the current level needed via a programmable current source for each of the three different functionalities. This state machine may be controlled by the external processor during runtime or during a power up/down procedure.

In some in-line characterization parameter identification processes, a first cycle may be used to measure a voltage threshold of the power switch, and a second cycle may be used to measure the gate to source voltage (or collector-to-emitter voltage) as a function of time. During the first cycle, a comparator can be triggered and samples can be stored before and after the triggering event. During the second cycle, gate to source capacitance, gate to drain charge, and ON state capacitance may be determined.

Figure 3:
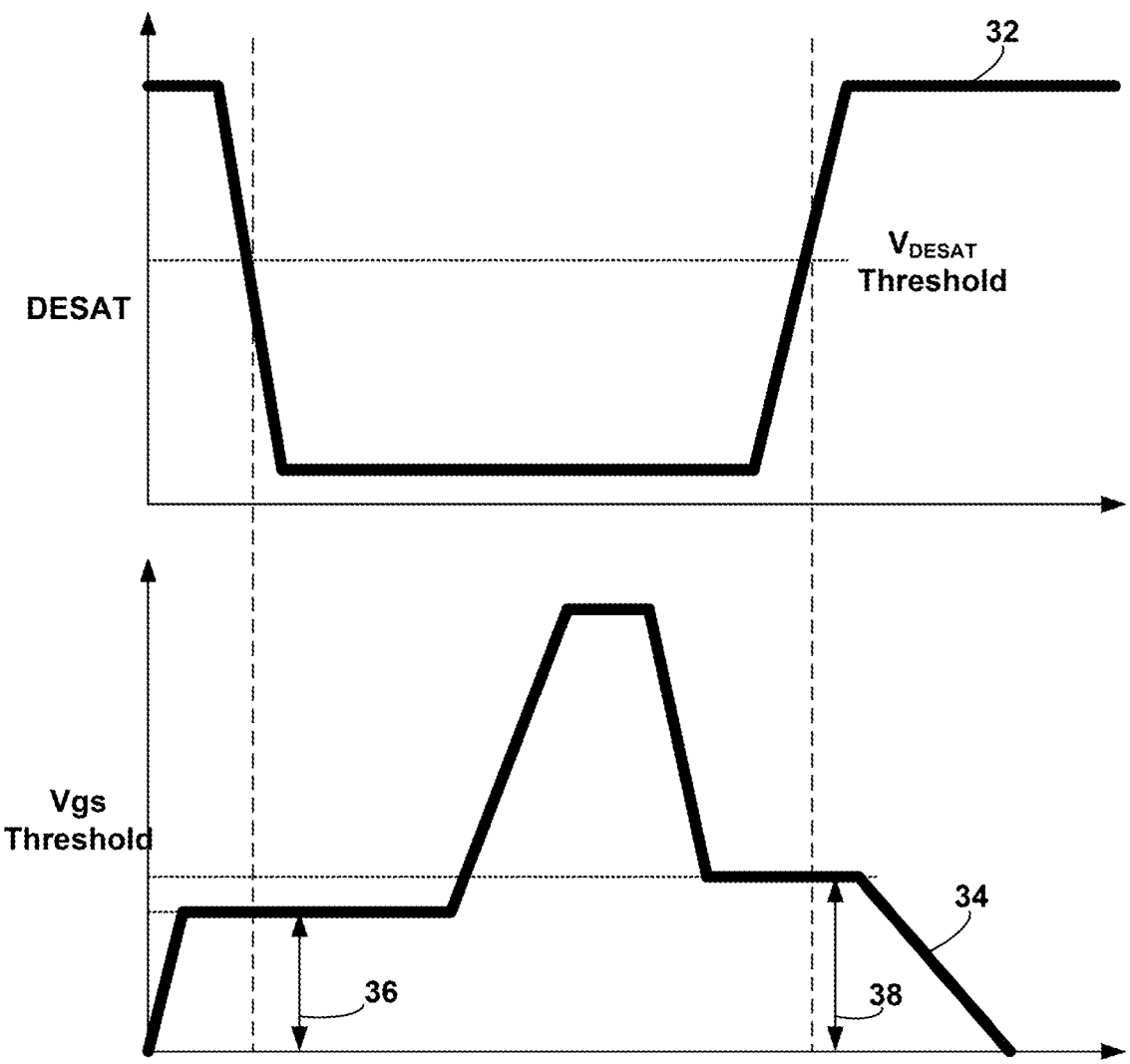
FIG. 3 is a set of graphs illustrating detection of voltage thresholds associated with a power switch.

FIG. 3 is a set of graphs illustrating detection of voltage thresholds associated with a power switch. This example may involve initiating a one-time threshold measurement via external pin or via digital communication interface. e.g. serial peripheral interface (SPI). The top graph 32 in FIG. 3 illustrates DESAT voltage as a function of time. A voltage threshold ($V_{DESAT}$ threshold) is labeled. The bottom graph 34 is the corresponding gate-to-source voltage Vgs of the power switch. In some examples, the techniques of this disclosure can use the DESAT pin to identity the occurrence of the $V_{DESAT}$ threshold, in order to determine when to measure Vgs threshold 38 associated with turn OFF. In some examples, as noted, the VGS threshold 36 at turn ON can also be used, in which case the Vgs threshold can be determined based on a mean of Vgs threshold 38 associated with turn OFF and Vgs threshold 36 at turn ON.

The in-line characterization process may include charging with a configurable current source (e.g., current source 256 of FIG. 2) to change the voltage on DESAT pin 262 from High to Low, which represents the power switch threshold Low value. In some examples, driver circuit 20 may measure this value (with optional oversampling) with integrated ADC within measurement unit 242. Then, discharge may occur using a configurable current source (e.g., current source 258 of FIG. 2) to change in DESAT from Low to High. The techniques of this disclosure may measure this Vgs threshold value with optional oversampling with an ADC. Also, the techniques may combine the measurement results with one or more internal or external temperature measurements, e.g., based on temperature sensor 240 to get temperature-dependent Vgs measurements.

The techniques of this disclosure may provide for more accurate measurements based on temperature dependency and based on high and low threshold measurements. A mean value of the high and low threshold may be used to more accurately determine the actual Vgs threshold of the power switch and based on temperature. In some examples, techniques of this disclosure may also compensate for DESAT timing impact on the measurements.

Figure 4:
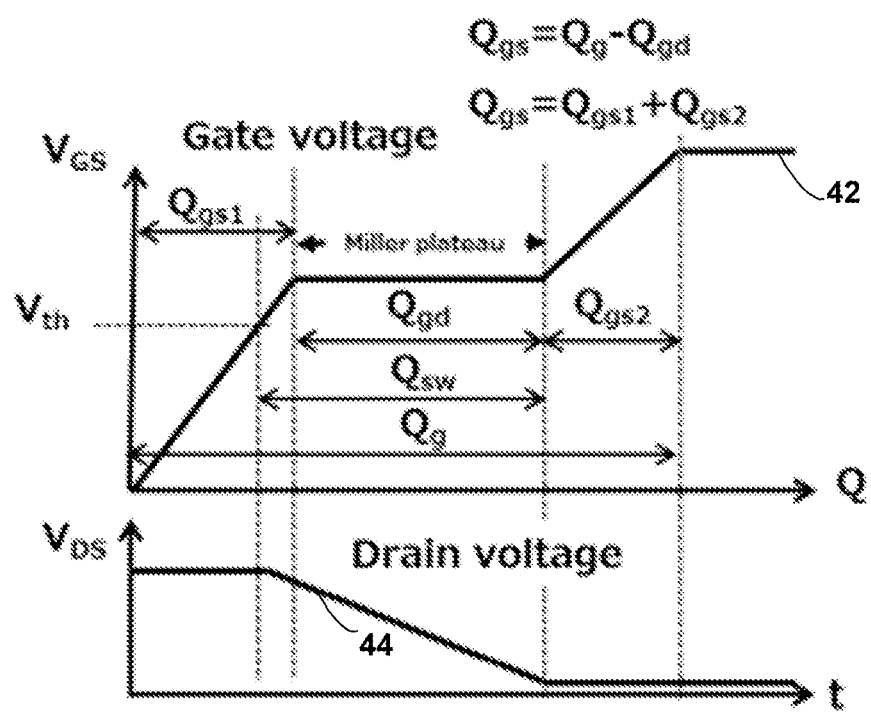
FIG. 4 is a set of graphs illustrating detection of gate charge parameters associated with a power switch.

FIG. 4 is a set of graphs illustrating detection of gate charge parameters associated with a power switch, which may be determined based on measurements performed as a function of drain voltage 44 and gate voltage 42 over time. Any of the gate charge parameters "Q" shown in FIG. 4 may be determined by a gate driver circuit or by a processor by measuring gate-to-source voltage threshold Vth and possibly by identifying the beginning and end of the miller plateau. For example, determinable parameters may include Gate-to-Source charge on turn ON Qgs1, gate-to-drain charge Qgd during the miller plateau, switching charge Qsw, gate charge Qg, gate-to source charge during turn OFF Qgs2. Gate-to-source charge Qgs may be determined as the difference between gate charge Qg and gate-to-drain charge Qgd. Gate-to-source charge may also be determined as the summation of Qgs1 and Qgs2. The determinations may be made by a gate driver, or by a processor that receives measured parameters from the gate driver.

Gate input terminal (G) of a MOSFET is insulated, and therefore, the amount of charge Q seen from the gate are important characteristics, which are shown and defined in FIG. 4 and further explained in Table 1 below:

TABLE 1

| Characteristic | Symbol | Unit | Description |
| --- | --- | --- | --- |
| Total gate charge | $Q_g$ | nC | The amount of charge to apply voltage (from zero to designated voltage) to gate |
| Gate-source charge 1 | $Q_{gs1}$ | | The amount of charge required for a MOSFET to begin to turn on (before dropping drain-source voltage) |
| Gate-drain charge | $Q_{gd}$ | | As the MOSFET begins to turn on, the drain-source voltage begins to |

TABLE 1-continued

| Characteristic | Symbol | Unit | Description |
| --- | --- | --- | --- |
| | | | fall, charging the gate-drain capacitance. The gate-source voltage stops increasing and reaches the Miller plateau. From this point to the ending point of Miller plateau is known as the gate-drain charge period. |
| Gate switch charge | $Q_{sw}$ | | The amount of charge stored in the gate capacitance from when the gate-source voltage has reached $V_{sh}$ until the end of the Miller plateau |
| Output charge | $Q_{ocs}$ | | Drain-source charge |

Figure 5:
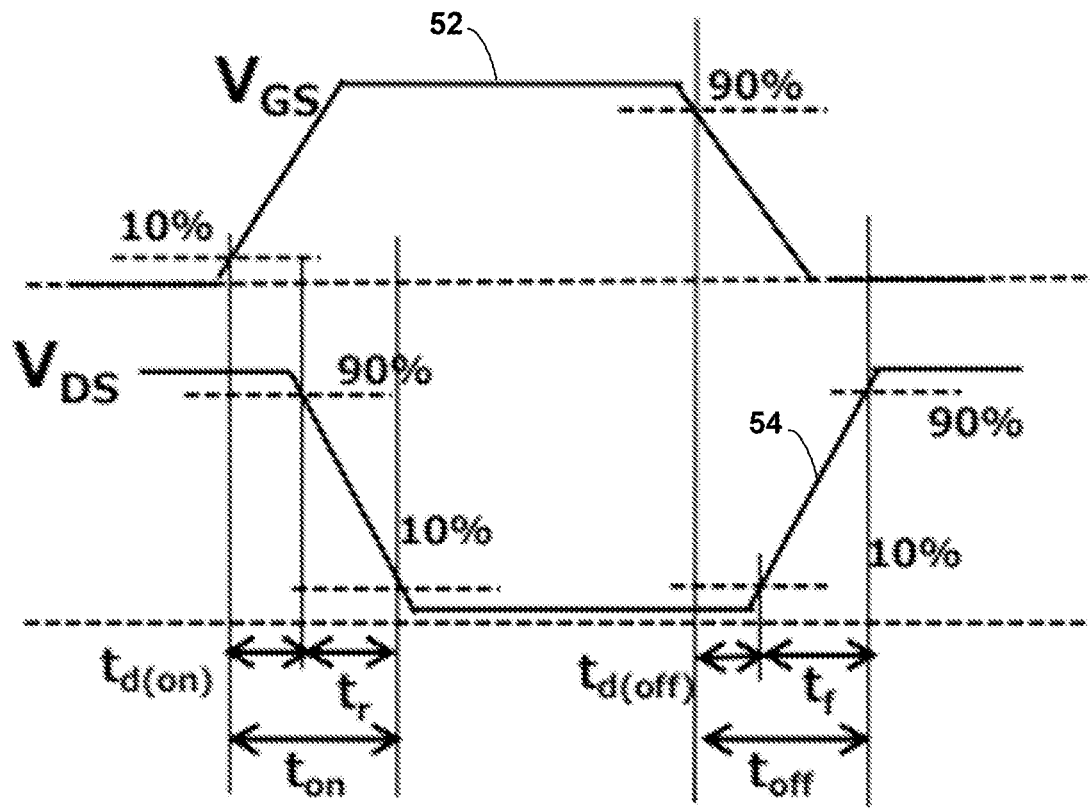
FIG. 5 is a graph showing determinations of turn on time and turn off time of a power switch.

FIG. 5 is a graph showing determinations of turn on time and turn off time of a power switch. In particular, FIG. 5 shows a graph of gate-to-source voltage $V_{GS}$ 52 of a power switch (e.g., the input waveform), and corresponding graph of drain-to-source voltage $V_{DS}$ 54 of the power switch over time (e.g., the output waveform). $T_{on}$ delay may correspond to a rise time of $V_{GS}$ and tr (which is the fall time of $V_{DS}$ caused by the rise in $V_{GS}$. The toff delay may correspond to the fall time of $V_{GS}$ and $t_f$ (which is the rise time of $V_{DS}$ caused by the fall in $V_{GS}$). Since $T_{on}$ delay and $T_{off}$ delay generally mimic each other, in some examples, it is possible to use $T_{off}$ measurement as a measure of $T_{on}$, and vice versa.

Figure 6:
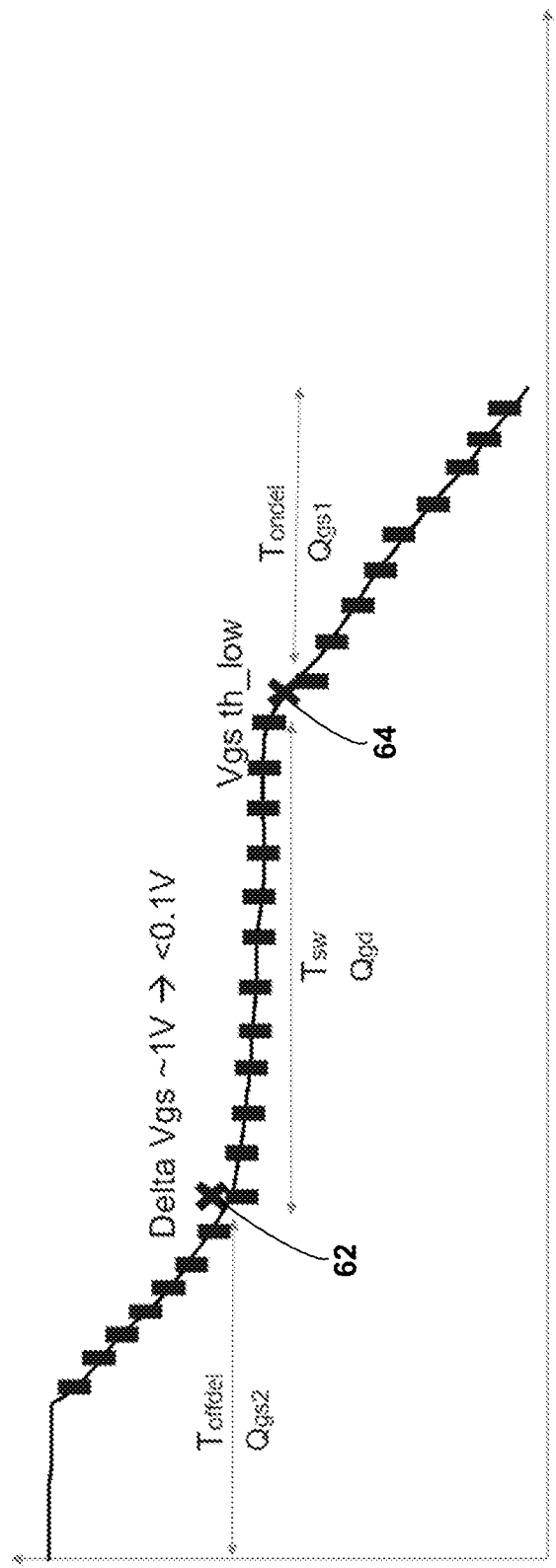
FIG. 6 is graph of gate voltage values measured by an analog-to-digital converter (ADC) with equidistance time stamps, which can be used to determine turn on delay and turn off delay of a power switch.

FIG. 6 is graph of gate voltage values measured by an ADC with equidistance time stamps, which can be used to determine turn on delay and turn off delay of a power switch. In this example, power switch 24 is turned off via multi-functional pin 268 and based on a low current provided by current source 258. State machine 26 may define the current level as that used for the characterization process. Measurement unit 242 comprising an ADC may sample the $V_{gs}$ voltage at equidistant time stamp events. Point 62 may define the beginning of the miller plateau, and point 62 may be determined when $V_{gs}$ changes by less than a threshold change amount (e.g, when delta $V_{gs}$ changes from being approximately 1 V between measurements to less than 0.1V. Similarly, point 64 may define the end of the miller plateau, and point 64 may be determined when $V_{gs}$ changes by greater than a threshold change amount (e.g, when delta $V_{gs}$ changes from being approximately less than 0.1V back to approximately 1 V between measurements. Of course, different values can be used for the expected changes and the changes at the miller plateau if faster or slower sampling is used by the ADC to get better accuracy (faster ADC sampling) or lower cost implementation (slower ADC sampling).

For example, FIG. 6 shows a technique for measuring both turn on delay and turn off delay. In some examples, the turn on delay may be measured during the turn off process since the turn ON mirrors the turn OFF curve after the miller plateau.

According to FIG. 6, a current source 258 can turn off power switch 24 using multi-functional pin 268 in a controlled slow manner to measure all the required electrical characteristics of the power switch. The switch is turned ON, and then the power switch is turned off with controlled configurable current source, as the ADC samples the turn off and searches the trigger points. The decrease of delta-voltage is defined by two adjacent ADC measurements, which can be compared to define the voltage slope and determine the beginning of the miller plateau.

Figure 7:
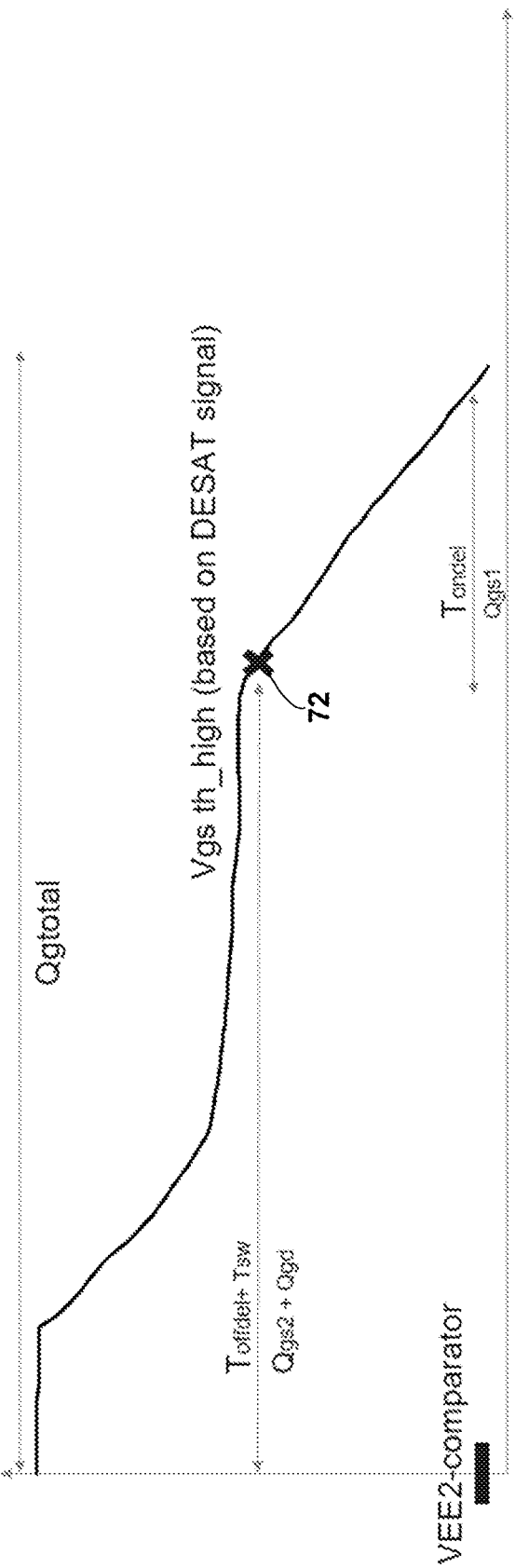
FIG. 7 is graph of a gate voltage value that can be identified by a comparator where the DESAT function is used for a time measurement, which can be used to determine turn on delay of a power switch.

FIG. 7 is graph of a gate voltage value that can be identified by a comparator where the DESAT function is used for a time measurement, which can be used to determine turn on delay of a power switch. In this example, power switch 24 is turned off via multi-functional pin 268 and based on a low current provided by current source 258. State machine 26 may define the current level as that used for the characterization process. Measurement unit 242 comprising a comparator may determine Ton delay Qgs1 by either starting or stopping a timer when Vgs th_high occurs, based on a measured DESAT signal on DESAT pin 262. The event at point 72 corresponds to a measure of the Toff delay in combination with the miller plateau (e.g., Toffdel+Tsw).

In the technique shown in FIG. 7, the DESAT pin 262 monitors drain to source (or collector to emitter for IBGT), and this measurement can be used to detect ON and OFF of the power switch. Measurement unit 242 includes comparator, which is configured to start a timer 244 when the process starts and end timer when DESAT pin detects that the switch is turned OFF after miller plateau.

Thus, with the example of FIG. 6, measurement unit 242 comprises an ADC and timer 244 is a clock to define the equidistant times when the ADC should perform its measurements. In contrast, with the example of FIG. 7, measurement unit 242 comprises a comparator, and timer 244 comprises a clock and a counter to determine the length of time for the Ton delay, after point 72 to the point where Vgs reaches a low threshold defined by the comparator of measurement unit 242.

Then, either the gate driver or an external processor may use the measured parameters to calculate Charge (Q) associated with the power switch. Since I=Q/t and the current I is a known value (the current from current source 258 during the characterization process), upon measuring T (turn on delay or turn off delay), a processor or the driver circuit can calculate Q as the sum of T and I. Capacitance of the switch can also be determined based on Q and the voltage, and these values may be defined based on temperature measured by temperature sensor 240 to provide a good characterization of the power switch.

By using very low current during the calibration process, the turn on and turn off are slowed down to facilitate easier measurements. Also, as noted above, turn off can use an existing current source 258, which is already needed for soft turn off and clamping (e.g., at Vee2 for turn off). Additional current source 256 (at Vcc2 is for turn on) is optional to allow for even better measurements by combining and using the mean of measurements during turn on and turn off.

In some examples, this disclosure describes a multi-functional pin with integrated state machine for performing both functional operations (clamping and soft turn off) and characterization operations. In some examples, this disclosure measures voltage threshold of a power switch with the use of DESAT information changing. The techniques of this disclosure can be performed at turn off (levering an existing current source needed for soft turn off functionality or can be done with both turn ON and turn OFF, in which case the combined information can help compensate for the impact of DESAT circuitry. The combined information measured at turn ON and turn OFF may also be combined with internal and external temperature measurements to characterize the device as a function of operational temperature. Measured or determined parameters may include Qgs, Qgd, Tondel, Tsw, and Toffdel.

In some examples, using turn OFF to characterize the power switch may provide advantages over using turn ON. Turn ON is mainly defined by threshold, temperature, and gm by the external switching component. Turn OFF is mainly defined by the internal current source and the capacitive load at the DESAT pin. For this reason, turn off can be more accurate than turn on, and as noted, a combination of both turn ON and turn OFF can provide even more precise characterization measurements than using only turn ON or only turn OFF.

Measurement of total gate charge Qg can be done by integrating the current with a dedicated timer running. In some cases, measurement of Qgs occurs before a threshold and after the threshold, to determine Qgs1 and Qgs2. In some examples, measurement of Qgs2+Qgd may occur in response to the change of DESAT information (e.g., Vdesat_th_low to_DESAT_th_high). Timer start and stop criteria can be performed via ADC measurement. Q (charge) information can also be used to determine capacitance, e.g., via a driver circuit or via a processor. For a system without an ADC, a comparator can be used to start and stop the timer based on a determined DESAT.

Figure 8:
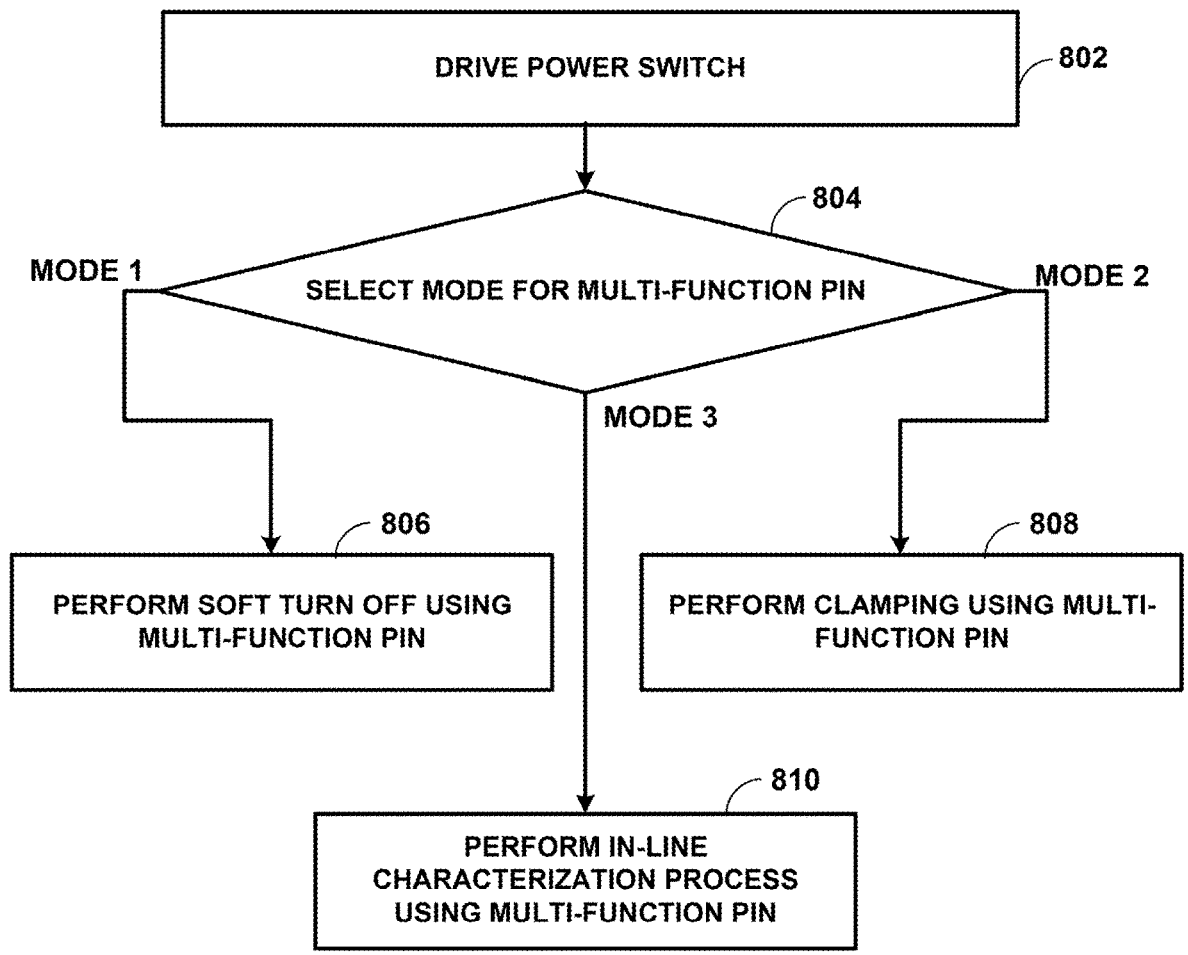
FIG. 8 is a flow diagram illustrating a method consistent with this disclosure.

FIG. 8 is a flow diagram illustrating a method consistent with this disclosure. As shown in FIG. 8, a driver circuit 10, 20 is configured to drive a power switch 110, 24 (802), such as by delivering PWM signals to the gate of power switch 110, 24. Logic 12, 22 of driver circuit 10, 20 selects an operational mode for multi-functional pin 118, 268. In a first mode (MODE 1), driver circuit 10, 20 performs soft turn off of power switch 110, 24 using multi-functional pin 118, 268 (806). For MODE 1, state machine 16, 26 may program a current source 258 to a first level of current is on the order of 1 amp. In a second mode (MODE 2), driver circuit 10, 20 performs a clamping operation on power switch 110, 24 using multi-functional pin 118, 268 (808). For MODE 2, state machine 16, 26 may program a current source 258 to a second level of current is on the order of 10 amps. In a third mode (MODE 3), driver circuit 10, 20 performs an in-line characterization process on power switch 110, 24 using multi-functional pin 118, 268 (810). For MODE 3, state machine 16, 26 may program a current source 258 (and optionally current source 256) to a third level of current in a range of 100 microamps to 1 milliamp.

The techniques described in this disclosure may be implemented, at least in part, in circuitry, hardware, software, firmware or any combination thereof. Such hardware, software, and firmware may be implemented within the same device or within separate devices to support the various operations and functions described in this disclosure. In addition, any of the described units, modules or components may be implemented together or separately as discrete but interoperable circuits or devices. Depiction of different features as modules or units is intended to highlight different functional aspects and does not necessarily imply that such modules or units must be realized by separate components. Rather, functionality associated with one or more modules or units may be performed by separate components or circuits or integrated within common components or circuits. It may also be possible for one or more aspects of this disclosure to be performed in software, in which case those aspects of the techniques described in this disclosure may also be embodied or encoded in a computer-readable medium.

The following numbered aspects demonstrate one or more aspects of the disclosure.

Clause 1—A driver circuit configured to control a power switch, the driver circuit comprising: an output pin, wherein the driver circuit is configured to deliver drive signals from the output pin to the power switch to control turn ON of the power switch; a multi-function pin; and a state machine configured to define operation of the driver circuit using the multi-function pin, wherein the state machine is configured to select among a soft turn OFF mode, a clamping mode, and an in-line characterization mode.

Clause 2—The driver circuit of clause 1, wherein the driver circuit further comprises: a DESAT detection pin configured to receive a signal associated with the power switch; and DESAT circuit elements and DESAT logic configured to detect whether the power switch is in a desaturation mode.

Clause 3—The driver circuit of clause 1 or 2, wherein the driver circuit includes one or more current sources connected to the multi-function pin, wherein the one or more current sources are configured to define three different levels of current on the multi-function pin, wherein a first level of current is defined for the soft turn OFF mode, a second level of current is defined for the clamping mode, and a third level of current is defined for the in-line characterization mode.

Clause 4—The driver circuit of clause 3, wherein the first level of current is on the order of 1 amp, wherein the second level of current is on the order of 10 amps, and wherein the third level of current is in a range of 100 microamps to 1 milliamp.

Clause 5—The driver circuit of any of clauses 1-4, wherein the soft turn off mode is configured to turn OFF the power switch when the power switch is ON, wherein the clamping mode is configured to ensure that the power switch remains OFF when the power switch is OFF, and wherein the in-line characterization mode is configured to perform one or more measurements of one or more operational characteristics of the power switch.

Clause 6—The driver circuit of any of clauses 1-5, wherein the driver circuit is configured to perform an in-line characterization process to measure one or more circuit parameters of the power switch in response to the state machine selecting the in-line characterization mode.

Clause 7—The driver circuit of clause 6, wherein the in-line characterization process includes a measurement of a voltage threshold associated with the power switch during a turn OFF phase, wherein a turn ON delay is determined based on the voltage threshold associated with the power switch during a turn OFF phase.

Clause 8—The driver circuit of clause 6 or 7, wherein the in-line characterization process includes a first measurement of voltage threshold associated with the power switch during a turn ON phase and a second measurement of the voltage threshold associated with the power switch during a turn OFF phase, wherein the voltage threshold associated with the power switch is defined based on a combination of the first measurement and the second measurement.

Clause 9—The driver circuit of clause 8, wherein the voltage threshold associated with the power switch is defined as a function of temperature, based on the combination of the first measurement and the second measurement, and based on one or more temperature measurements associated with the power switch.

Clause 10—The driver circuit of clause 8 or 9, wherein the voltage threshold associated with the power switch is defined based on a mean value of the first measurement and the second measurement.

Clause 11—The driver circuit of any of clauses 6-10, wherein the in-line characterization process includes one or more measurements of gate voltage associated with the power switch.

Clause 12—The driver circuit of any of clauses 6-11, wherein the in-line characterization process includes one or more measurements of delay associated with the power switch turning ON or OFF.

Clause 13—The driver circuit of any of clauses 6-12, wherein the in-line characterization process includes one or more measurements of gate voltage associated with the power switch during a turn OFF phase of the power switch, and wherein the driver circuit is configured to determine one parameters of delay associated with the power switch during the turn OFF phase of the power switch based on the one or more measurements of gate voltage.

Clause 14—The driver circuit of clause 13, wherein the driver circuit includes a DESAT detection pin and a comparator configured to perform the one or more measurements of gate voltage associated with the power switch, wherein the driver circuit includes a timer comprising a clock and a counter configured track a delay parameter associated with the power switch, wherein the timer is triggered based on an event detected by the DESAT detection pin of the driver circuit.

Clause 15—The driver circuit of clause 13, wherein the driver circuit includes an ADC configured to perform the one or more measurements of gate voltage associated with the power switch.

Clause 16—The driver circuit of clause 15, wherein the driver circuit includes a timer comprising a clock for identifying equidistant points in time for the ADC to perform the one or more measurements of gate voltage.

Clause 17—The driver circuit of any of clauses 6-16, wherein the in-line characterization process includes: one or more measurements of gate voltage associated with the power switch during a turn OFF phase of the power switch, and one or more measurements of gate voltage associated with the power switch during a turn ON phase of the power switch, wherein the driver circuit is configured to: determine one or more measurements of turn-OFF delay associated with the power switch based on both the one or more measurements of gate voltage during the turn OFF phase and the one or more measurements of gate voltage during the turn ON phase; and determine one or more measurements of turn-ON delay associated with the power switch based on both the one or more measurements of gate voltage during the turn OFF phase and the one or more measurements of gate voltage during the turn ON phase.

Clause 18—The driver circuit of clause 17, wherein the driver circuit includes: an ADC configured to perform the one or more measurements of gate voltage associated with the power switch during the turn-ON phase and during the turn-OFF phase; and a timer comprising a clock for identifying equidistant points in time for the ADC to perform the one or more measurements of gate voltage during the turn OFF phase and during the turn ON phase.

Clause 19—The driver circuit of any of clauses 6-18, wherein the circuit parameters include a delay parameter, and the driver circuit is further configured to determine a gate charge parameter based on delay parameter and a level of current used on the multi-function pin.

Clause 20—The driver circuit of any of clauses 6-19, wherein the driver circuit is further configured to determine a capacitance associated with the power switch based on gate charge and gate voltage.

Clause 21—The driver circuit of any of clauses 6-20, wherein the driver circuit includes a digital interface to a processor and wherein the driver circuit is configured to output one or more in-line characterization parameters to the processor in response to operating in the in-line characterization mode.

Clause 22—A method of operating a driver circuit for controlling a power switch, the method comprising: delivering drive signals from an output pin to the power switch to control turn ON of the power switch; and controlling a multi-function pin via a state machine, wherein the state machine is configured to select among a soft turn OFF mode for the power switch, a clamping mode for the power switch, and an in-line characterization mode for the power switch.

Clause 23—A system comprising: a power switch; a driver circuit configured to control the power switch based on drive signal; and a processor configured to deliver control signals to the driver circuit, wherein the control signals define the drive signals, wherein the driver circuit comprises: an output pin, wherein the driver circuit is configured to deliver the drive signals from the output pin to the power switch to control turn ON of the power switch; a multi-function pin; and a state machine configured to define operation of the driver circuit using the multi-function pin, wherein the state machine is configured to select among a soft turn OFF mode, a clamping mode, and an in-line characterization mode.

Clause 24—The system of clause 23, wherein the driver circuit includes the features of any of clauses 2-21.

Various aspects have been described in this disclosure. These and other aspects are within the scope of the following claims.

The invention claimed is:

1. A driver circuit configured to control a power switch, the driver circuit comprising:
an output pin, wherein the driver circuit is configured to deliver drive signals from the output pin to the power switch to control turn ON of the power switch;
a multi-function pin; and
a state machine configured to define operation of the driver circuit using the multi-function pin, wherein the state machine is configured to select among a soft turn OFF mode, a clamping mode, and an in-line characterization mode, wherein the driver circuit is configured to perform an in-line characterization process to measure one or more circuit parameters of the power switch in response to the state machine selecting the in-line characterization mode,
wherein the in-line characterization process includes one or more measurements of gate voltage associated with the power switch during a turn OFF phase of the power switch, and wherein the driver circuit is configured to determine one or more parameters of delay associated with the power switch during the turn OFF phase of the power switch based on the one or more measurements of gate voltage,
wherein the driver circuit includes a desaturation (DESAT) detection pin and a comparator configured to perform the one or more measurements of gate voltage associated with the power switch, wherein the driver circuit includes a timer comprising a clock and a counter configured track a delay parameter associated with the power switch, and wherein the timer is triggered based on an event detected by the DESAT detection pin of the driver circuit.

2. The driver circuit of claim 1, wherein the driver circuit further comprises:

DESAT circuit elements and DESAT logic configured to detect whether the power switch is in a desaturation mode.

3. The driver circuit of claim 1, wherein the driver circuit includes one or more current sources connected to the multi-function pin, wherein the one or more current sources are configured to define three different levels of current on the multi-function pin, wherein a first level of current is defined for the soft turn OFF mode, a second level of current is defined for the clamping mode, and a third level of current is defined for the in-line characterization mode.

4. The driver circuit of claim 3, wherein the first level of current is on the order of 1 amp, wherein the second level of current is on the order of 10 amps, and wherein the third level of current is in a range of 100 microamps to 1 milliamp.

5. The driver circuit of claim 1, wherein the soft turn off mode is configured to turn OFF the power switch when the power switch is ON, wherein the clamping mode is configured to ensure that the power switch remains OFF when the power switch is OFF, and wherein the in-line characterization mode is configured to perform one or more measurements of one or more operational characteristics of the power switch.

6. The driver circuit of claim 1, wherein the one or more measurements of gate voltage during the in-line characterization process includes a measurement of a voltage threshold associated with the power switch during a turn OFF phase, wherein a turn ON delay is determined based on the voltage threshold associated with the power switch during a turn OFF phase.

7. The driver circuit of claim 1, wherein the one or more measurements of gate voltage during the in-line characterization process includes a first measurement of voltage threshold associated with the power switch during a turn ON phase and a second measurement of the voltage threshold associated with the power switch during a turn OFF phase, wherein the voltage threshold associated with the power switch is defined based on a combination of the first measurement and the second measurement.

8. The driver circuit of claim 7, wherein the voltage threshold associated with the power switch is defined as a function of temperature, based on the combination of the first measurement and the second measurement, and based on one or more temperature measurements associated with the power switch.

9. A driver circuit configured to control a power switch, the driver circuit comprising:
an output pin, wherein the driver circuit is configured to deliver drive signals from the output pin to the power switch to control turn ON of the power switch;
a multi-function pin; and
a state machine configured to define operation of the driver circuit using the multi-function pin, wherein the state machine is configured to select among a soft turn OFF mode, a clamping mode, and an in-line characterization mode, wherein the driver circuit is configured to perform an in-line characterization process to measure one or more circuit parameters of the power switch in response to the state machine selecting the in-line characterization mode,
wherein the one or more measurements of gate voltage in the in-line characterization mode during an in-line characterization process includes a first measurement of voltage threshold associated with the power switch during a turn ON phase and a second measurement of the voltage threshold associated with the power switch during a turn OFF phase, wherein the voltage threshold associated with the power switch is defined based on a combination of the first measurement and the second measurement, and
wherein the voltage threshold associated with the power switch is defined based on a mean value of the first measurement and the second measurement.

10. A driver circuit configured to control a power switch, the driver circuit comprising:
an output pin, wherein the driver circuit is configured to deliver drive signals from the output pin to the power switch to control turn ON of the power switch;
a multi-function pin; and
a state machine configured to define operation of the driver circuit using the multi-function pin, wherein the state machine is configured to select among a soft turn OFF mode, a clamping mode, and an in-line characterization mode, wherein the in-line characterization process includes one or more measurements of gate voltage associated with the power switch during a turn OFF phase of the power switch, and wherein the driver circuit is configured to determine one or more parameters of delay associated with the power switch during the turn OFF phase of the power switch based on the one or more measurements of gate voltage,
wherein the driver circuit includes:
an analog-to-digital converter (ADC) configured to perform the one or more measurements of gate voltage associated with the power switch, and
a timer comprising a clock for identifying equidistant points in time for the ADC to perform the one or more measurements of gate voltage.

11. A driver circuit configured to control a power switch, the driver circuit comprising:
an output pin, wherein the driver circuit is configured to deliver drive signals from the output pin to the power switch to control turn ON of the power switch;
a multi-function pin; and
a state machine configured to define operation of the driver circuit using the multi-function pin, wherein the state machine is configured to select among a soft turn OFF mode, a clamping mode, and an in-line characterization mode, wherein the driver circuit is configured to perform an in-line characterization process to measure one or more circuit parameters of the power switch in response to the state machine selecting the in-line characterization mode, wherein the in-line characterization process includes:
one or more measurements of gate voltage associated with the power switch during a turn OFF phase of the power switch, and
one or more measurements of gate voltage associated with the power switch during a turn ON phase of the power switch,
wherein the driver circuit is configured to:
determine one or more measurements of turn-OFF delay associated with the power switch based on both the one or more measurements of gate voltage during the turn OFF phase and the one or more measurements of gate voltage during the turn ON phase; and
determine one or more measurements of turn-ON delay associated with the power switch based on both the one or more measurements of gate voltage during the turn OFF phase and the one or more measurements of gate voltage during the turn ON phase.

12. The driver circuit of claim 11, wherein the driver circuit includes:

an analog-to-digital converter (ADC) configured to perform the one or more measurements of gate voltage associated with the power switch during a turn-ON phase and during a turn-OFF phase; and a timer comprising a clock for identifying equidistant points in time for the ADC to perform the one or more measurements of gate voltage during the turn OFF phase and during the turn ON phase.

13. The driver circuit of claim 11, wherein the circuit parameters include a delay parameter, and the driver circuit is further configured to determine a gate charge parameter based on delay parameter and a level of current used on the multi-function pin.

14. The driver circuit of claim 11, wherein the driver circuit is further configured to determine a capacitance associated with the power switch based on gate charge and gate voltage.

15. The driver circuit of claim 11, wherein the driver circuit includes a digital interface to a processor and wherein the driver circuit is configured to output one or more in-line characterization parameters to the processor in response to operating in the in-line characterization mode.

16. A method of operating a driver circuit for controlling a power switch, the method comprising:
    delivering drive signals from an output pin to the power switch to control turn ON of the power switch;
    controlling a multi-function pin via a state machine, wherein the state machine is configured to select among a soft turn OFF mode for the power switch, a clamping mode for the power switch, and an in-line characterization mode for the power switch;
    performing an in-line characterization process to measure one or more circuit parameters of the power switch in response to the state machine selecting the in-line characterization mode,
    wherein performing the in-line characterization process includes:
        performing one or more measurements of gate voltage associated with the power switch during a turn OFF phase of the power switch, and
        performing one or more measurements of gate voltage associated with the power switch during a turn ON phase of the power switch,
    determining one or more measurements of turn-OFF delay associated with the power switch based on both the one or more measurements of gate voltage during the turn OFF phase and the one or more measurements of gate voltage during the turn ON phase; and
    determining one or more measurements of turn-ON delay associated with the power switch based on both the one or more measurements of gate voltage during the turn OFF phase and the one or more measurements of gate voltage during the turn ON phase.

17. A system comprising:
    a power switch;
    a driver circuit configured to control the power switch based on drive signal; and
    a processor configured to deliver control signals to the driver circuit, wherein the control signals define the drive signals, wherein the driver circuit comprises:
    an output pin, wherein the driver circuit is configured to deliver the drive signals from the output pin to the power switch to control turn ON of the power switch;
    a multi-function pin; and
    a state machine configured to define operation of the driver circuit using the multi-function pin, wherein the state machine is configured to select among a soft turn OFF mode, a clamping mode, and an in-line characterization mode, wherein the driver circuit is configured to perform an in-line characterization process to measure one or more circuit parameters of the power switch in response to the state machine selecting the in-line characterization mode, wherein the in-line characterization process includes:
    one or more measurements of gate voltage associated with the power switch during a turn OFF phase of the power switch, and
    one or more measurements of gate voltage associated with the power switch during a turn ON phase of the power switch,
    wherein the driver circuit is configured to:
    determine one or more measurements of turn-OFF delay associated with the power switch based on both the one or more measurements of gate voltage during the turn OFF phase and the one or more measurements of gate voltage during the turn ON phase; and
    determine one or more measurements of turn-ON delay associated with the power switch based on both the one or more measurements of gate voltage during the turn OFF phase and the one or more measurements of gate voltage during the turn ON phase.

\* \* \* \* \*